(12) United States Patent
Shinjo et al.

(10) Patent No.: US 6,204,662 B1
(45) Date of Patent: *Mar. 20, 2001

(54) MAGNETIC FIELD SENSING ELEMENT WITH PROCESSING CIRCUIT AND INPUT AND OUTPUT SIDE RESISTORS FORMED FROM SAME METAL FILM

(75) Inventors: Izuru Shinjo; Yasuyoshi Hatazawa; Takuji Nada; Masahiro Yokotani, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/176,427

(22) Filed: Oct. 21, 1998

(30) Foreign Application Priority Data

May 14, 1998 (JP) .................................................. 10-132257

(51) Int. Cl.$^7$ .......................... G01R 33/09; G01P 3/488; G01B 7/30; G01D 5/20; H01L 43/08
(52) U.S. Cl. .................. 324/252; 324/207.21; 324/174; 257/427; 338/32 R
(58) Field of Search ...................... 324/173, 174, 324/207.12, 207.2, 207.21, 207.22, 207.25, 251, 252; 338/32 R, 32 H; 257/421, 427

(56) References Cited

U.S. PATENT DOCUMENTS

| 4,687,994 | * | 8/1987 | Fulkerson et al. | 324/251 |
| 5,084,674 | * | 1/1992 | Lachmann et al. | 324/174 |
| 6,072,311 | * | 6/2000 | Shinjo et al. | 324/174 |

FOREIGN PATENT DOCUMENTS

| 195 23 322 | 1/1997 | (DE) . |
| 196 49 400 | 12/1997 | (DE) . |
| 197 44 090 | 10/1998 | (DE) . |
| 3-48715 | 5/1991 | (JP) . |
| 7-198736 | 8/1995 | (JP) . |

\* cited by examiner

*Primary Examiner*—Gerard Strecker
(74) *Attorney, Agent, or Firm*—Sughrue, Mion, Zinn, Macpeak & Seas, PLLC

(57) ABSTRACT

A magnetic field sensing element comprising a giant magnetic resistance element formed on a substrate for detecting a change in a magnetic field, an integrated circuit formed on the substrate for carrying out predetermined arithmetic processing based on a change in the magnetic field, and an input side protective resistor and an output side protective resistor provided on the input side and the output side, respectively, of the integrated circuit, wherein the metal film from which the input side resistor and the output side resistor are formed is identical to the metal film from which the integrated circuit is formed.

7 Claims, 13 Drawing Sheets

MAGNETIC FIELD SENSING ELEMENT WITH PROCESSING CIRCUIT AND INPUT AND OUTPUT SIDE RESISTORS FORMED FROM SAME METAL FILM

BACKGROUND OF THE INVENTION

1. Field of the Invention

The present invention relates to a magnetic field sensing element for detecting a change in a magnetic field, and more particularly, to an element used in a device for detecting the number of rotations of, for example, a gear-like magnetic rotating body.

2. Description of the Related Art

FIG. 26 is a partial enlarged view of an essential portion of a conventional magnetic field sensing device.

FIGS. 27 and 28 are a sectional side elevation and a bottom view, respectively, showing the internal structure of the conventional magnetic field sensing device. It is to be noted that the bottom view of FIG. 28 shows the magnetic field sensing device of FIG. 27 with its case removed.

As shown in FIG. 26, the conventional magnetic field sensing device comprises a magnetic field sensing device body 1 and a connector 2 connected with the magnetic field sensing device body 1.

As shown in FIG. 27, the magnetic field sensing device body 1 comprises a cylindrical case 3 made of synthetic resin, an electric circuit body 4 housed in the case 3, a rectangular-parallelopiped-shaped permanent magnet 5 provided at an end portion of the electric circuit body 4 (on the right side in FIG. 27), and a magnetic field sensing element 6 provided on the front surface of the permanent magnet 5 with a built-in giant magnetic resistance element (hereinafter referred to as a GMR element).

Further, as shown in FIG. 28, the electric circuit body 4 comprises a substrate 7 made of synthetic resin, resistors 8 and capacitors 9 provided on the substrate 7, and wiring 10 for electrically connecting the resistors 8, the capacitors 9, and the magnetic field sensing element 6.

In the above-mentioned magnetic field sensing device, rotation of the gear-like magnetic rotating body 11 provided in proximity to the magnetic field sensing element makes concavities 11a and convexities 11b of the magnetic rotating body 11 alternately approach the magnetic field sensing element 6, and thus, cause a change in the magnetic field of the permanent magnet 5 applied to the magnetic field sensing element 6.

This change in the magnetic field is detected as a change in voltage by the GMR element (not shown) inside the magnetic field sensing element 6. The change in voltage thus generated in the GMR element is output via a differential amplification circuit and a comparison circuit both in the magnetic field sensing element 6, to the outside as a pulse wave electric signal. This electric signal is transmitted via a terminal of the connector 2 to a computer unit (not shown) which calculates the rotation angle of the magnetic rotating body 11. It is to be noted that the resistors 8 and the capacitors 9 form a filter circuit which prevents external noise, including external surges, from penetrating to the magnetic field sensing element 6.

In the conventional magnetic field sensing element, since a lot of time is required to solder the resistors 8 and the capacitors 9 to the substrate 7, there is a problem in that the production efficiency of the magnetic field sensing device is low and the manufacturing cost is high.

Further, since space is required for assembling the resistors 8 and the capacitors 9 on the substrate 7, there is a problem in that the size of the magnetic field sensing element and the magnetic field sensing device as a whole accordingly become larger.

SUMMARY OF THE INVENTION

The present invention has been made to solve the above mentioned problems, and an object of the present invention is to provide a miniaturized magnetic field sensing element and a magnetic field sensing device with improved production efficiency and a lower manufacturing cost.

According to one aspect of the invention there is provided a magnetic field sensing element comprising: a giant magnetic resistance element formed on a substrate for detecting a change in a magnetic field; an integrated circuit formed on the substrate for carrying out predetermined arithmetic processing based on a change in the magnetic field detected by the giant magnetic resistance element; and an input side protective resistor and an output side protective resistor provided on the input side and the output side, respectively, of the integrated circuit, wherein the metal film from which the input side resistor and the output side resistor are formed is identical to the metal film from which the integrated circuit is formed.

According to another aspect of the invention, there is provided a magnetic field sensing element comprising: an integrated circuit formed on a substrate for carrying out predetermined arithmetic processing based on a change in a magnetic field detected by a giant magnetic resistance element; a level difference buffer layer formed on the integrated circuit and having a smooth surface; an input side protective resistor and an output side protective resistor provided on the level difference buffer layer together with the giant magnetic resistance element and connected to the input side and the output side, respectively, of the integrated circuit; and wiring for connecting the input side protective resistor with the integrated circuit and for connecting the output side protective resistor with the integrated circuit, wherein the metal film from which the input side resistor and the output side resistor are formed is identical to the metal film from which the wiring is formed.

In a preferred form of the invention, the metal film has a specific resistance of $2 \times 10^{-6}$ Ω·cm or more.

In accordance with another aspect of the present invention, the metal film is mainly formed of aluminum.

In accordance with a further aspect of the invention, the input side resistor and the output side resistor formed of the metal film are 10 to 20 μm in width.

In a preferred form of the present invention, the input side resistor and the output side resistor formed of the metal film are 1 to 2 μm in thickness.

In a further preferred form of the present invention, the input side resistor and the output side resistor are formed on the substrate.

According to further aspect of the invention, there is provided a magnetic field sensing device comprising: a magnetic rotating body having convexities and concavities along its outer periphery for rotating about an axis of rotation; a magnet arranged so as to face the outer periphery of the magnetic rotating body; and a magnetic field sensing element to a surface of the magnet facing the outer periphery of the magnetic rotating body, wherein the magnetic element detects a change in a magnetic field between the magnetic rotating body and the magnet upon rotation of the magnetic rotating body, and, based on the result of the detection, calculates the amount of rotation of the magnetic rotating body.

DETAILED DESCRIPTION OF THE PREFERRED EMBODIMENTS

Embodiment 1

Figure 1:
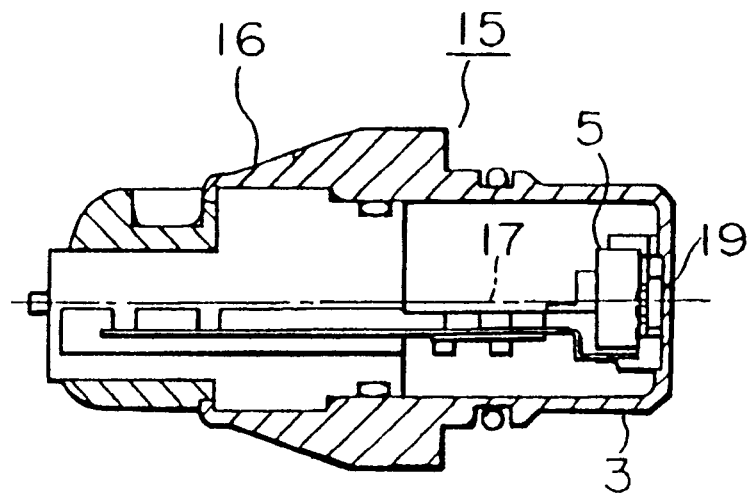
FIG. 1 is a sectional side elevation view of a magnetic field sensing device according to Embodiment 1 of the present invention.
Figure 2:
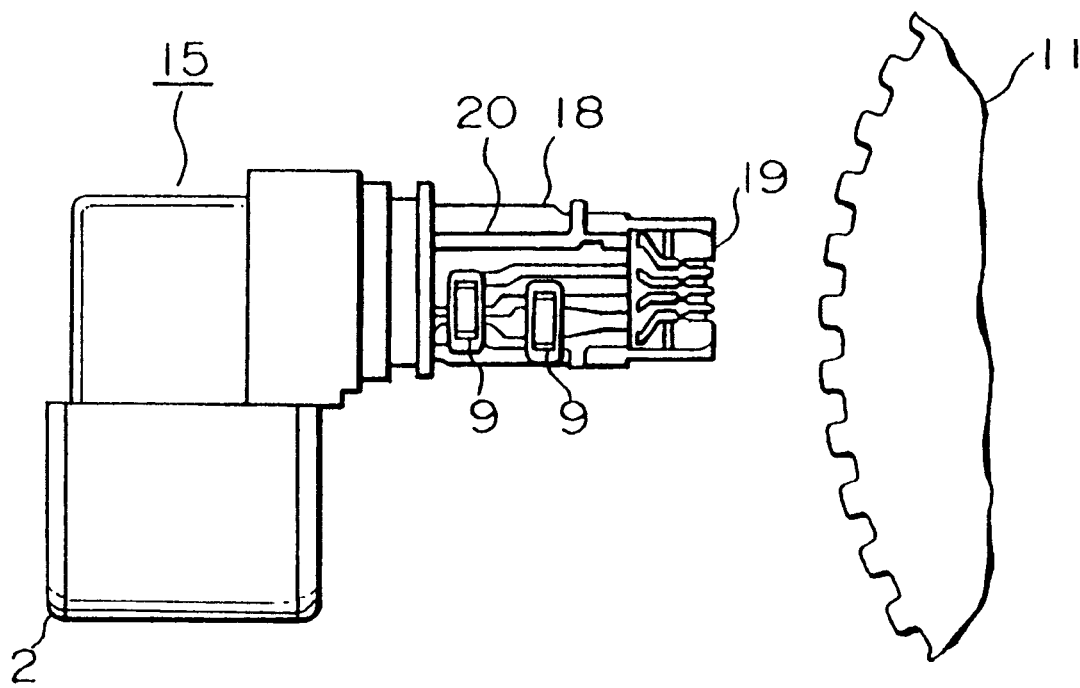
FIG. 2 is a bottom view with the case in FIG. 1 removed.

FIGS. 1 and 2 are a sectional side elevation and a bottom view, respectively, showing the internal structure of a magnetic field sensing device according to the present invention. It is to be noted that FIG. 2 is a bottom view of the magnetic field sensing device with the case 3 shown in FIG. 1 removed. It is also to be noted that like reference characters designate like or corresponding parts of the related art, and so the descriptions thereof are omitted.

A magnetic field sensing device 15 comprises a magnetic field sensing device body 16 and the connector 2 connected with the magnetic field sensing device body 16.

The magnetic field sensing device body 16 comprises the cylindrical case 3 made of synthetic resin, an electric circuit body 17, the permanent magnet 5, and a magnetic field sensing element 19 for sensing a magnetic field.

The electric circuit body 17 housed in the case 3 comprises a substrate 18 made of synthetic resin, the capacitors 9 provided on the substrate 18, and wiring 20 for connecting a terminal of the connector 2, the capacitors 9, and the magnetic field sensing element 19.

The permanent magnet 5 is provided at an end portion of the electric circuit body 17, and the magnetic field sensing element 19, with a giant magnetic resistance element (hereinafter referred to as a GMR element) built therein, is disposed in front of the permanent magnet 5.

Figure 3:
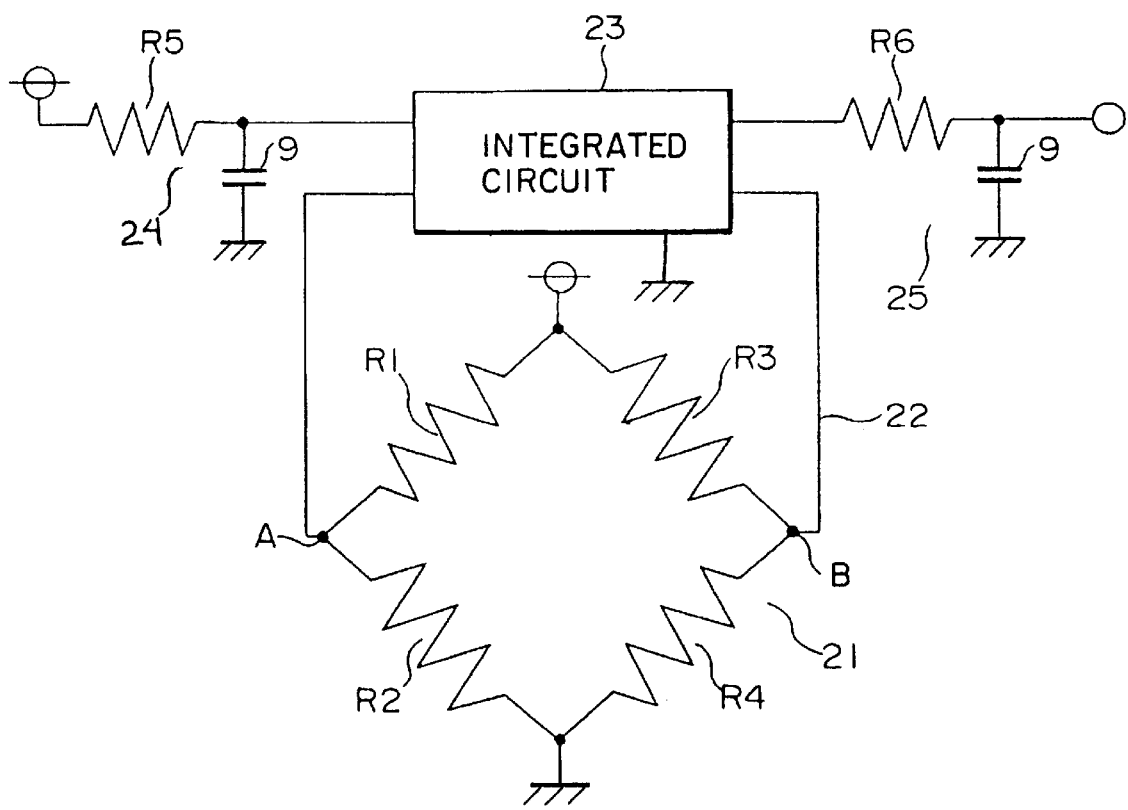
FIG. 3 is an electric circuit diagram of the magnetic field sensing device shown in FIG. 1.

FIG. 3 is a circuit diagram of the magnetic field sensing device.

Figure 4:
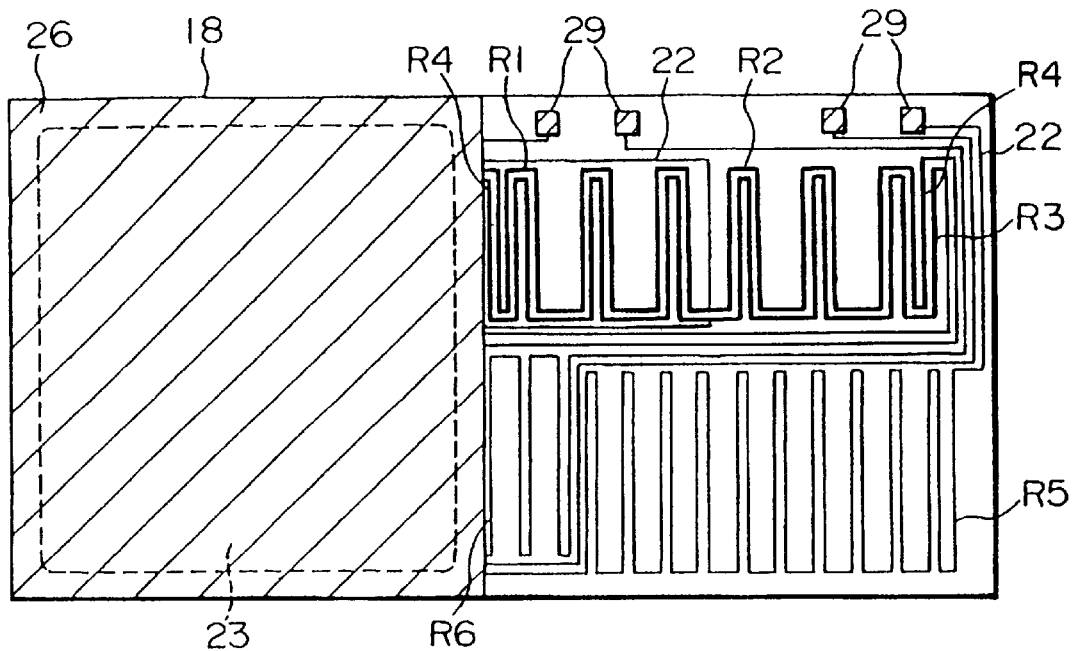
FIG. 4 is a plan view of the integrated circuit inside the magnetic field sensing element shown in FIG. 1.

FIG. 4 conceptually shows the structure of the magnetic field sensing element.

In FIG. 3, a magnetic detecting portion 21 comprising sensing resistors R1, R2, R3, and R4 arranged as a bridge circuit is connected via wiring 22 to an integrated circuit 23 comprising a differential amplification circuit and a comparison circuit (not shown). It is also to be noted that the GMR elements which are giant magnetic field sensing elements are used as the sensing resistors R1, R2, R3, and R4.

An input side filter circuit 24 as a first filter circuit is comprised of a resistor R5 arranged on the power source side and a capacitor 9 mounted on the substrate 18 on the power source side. An output side filter circuit 25 as a second filter circuit is comprised of an output side resistor R6 and another capacitor 9 also mounted on the substrate 18.

It is also to be noted that the input side filter circuit 24 for preventing noises from penetrating into the integrated circuit 23 may be formed solely by the capacitor 9.

The power source side resistor R5 and the output side resistor R6 of the magnetic field sensing element shown in FIG. 4 are both formed by patterning a metal film made of aluminum utilizing photolithography or the like.

As shown in FIG. 4, the integrated circuit 23 is formed under a protective film 26 formed at the left half of the magnetic field sensing element by sputtering.

The resistors R5 and R6 are made of an aluminum film which is identical to and formed by a process identical to that of an aluminum film formed (formed at the left half in FIG. 4) on an underlayer (not shown) for forming the integrated circuit 23 under the left half of the protective film 26 shown in FIG. 4.

More specifically, the input side resistor R5 and the output side resistor R6 are formed by patterning the aluminum film, using photolithography or the like, as a metal film formed at the right half in FIG. 4 simultaneous with and using a process identical to that of the aluminum film formed at the left half in FIG. 4.

It is to be noted that the integrated circuit 23 comprises the differential amplification circuit, the comparison circuit, and the like (not shown).

Since the specific resistance of aluminum is $2.8 \times 10^{-6}$ $\Omega \cdot cm$, which is relatively large, the area of the resistors R5 and R6 can be made small. Since the resistance of aluminum is approximately twice as large as that of copper, a resistor made of aluminum having an area which is approximately only half that of a resistor made of copper can obtain the same resistance. Generally, the resistance of the power source side resistor R5 is about 200 $\Omega$. The area of the wiring can be made smaller while maintaining this resistance by making the width and the thickness of the aluminum resistance wiring forming the resistors R5 and R6 smaller.

However, if the width of the aluminum resistance wiring is made extremely small, the problem of electromigration arises; moreover if the thickness of the aluminum resistance wiring is made extremely small, the aluminum wiring is liable to break.

It is known from experiments that breakage does not occur when the thickness is 1 to 2 $\mu m$ or more. Further, it is known that electromigration does not occur when the current per $\mu m$ of width of the aluminum resistance wiring is 1 mA or less.

Since, an electric current flowing through a magnetic field sensing device is generally suppressed to 10 to 20 mA, it is appropriate that the width of the aluminum wire be 10 to 20 $\mu m$. For example, when a resistance of 200 $\Omega$ is formed with an aluminum resistance wiring having a 15 $\mu m$ width and a 1.5 $\mu m$ thickness, the area of the aluminum resistance wire necessary to form the input side resistor R5 and the output side resistor R6 shown in FIG. 4 is approximately 4 $mm^2$.

Figure 26:
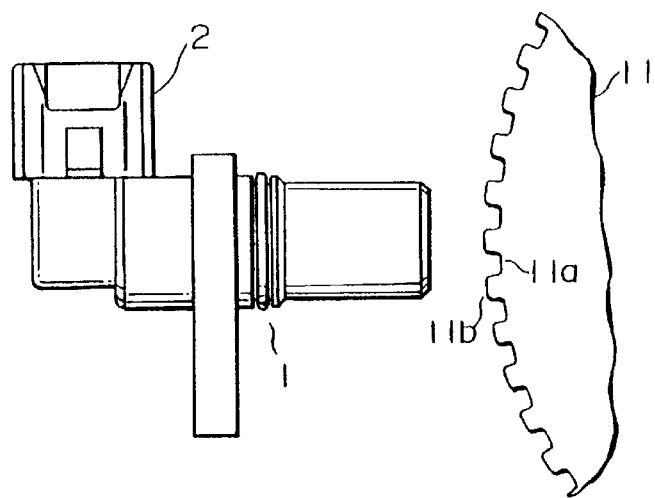
FIG. 26 is a partially enlarged view of a conventional magnetic field sensing device.
Figure 27:
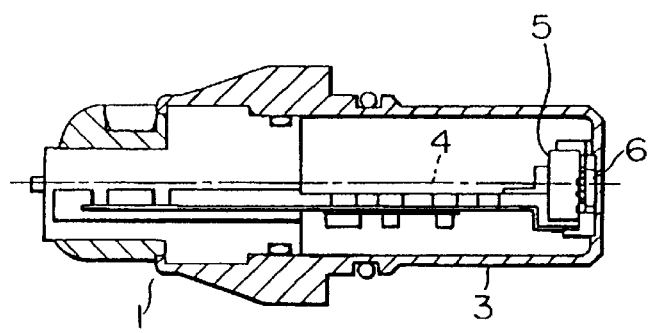
FIG. 27 is a sectional side elevation view showing the internal structure of the conventional magnetic field sensing device.
Figure 28:
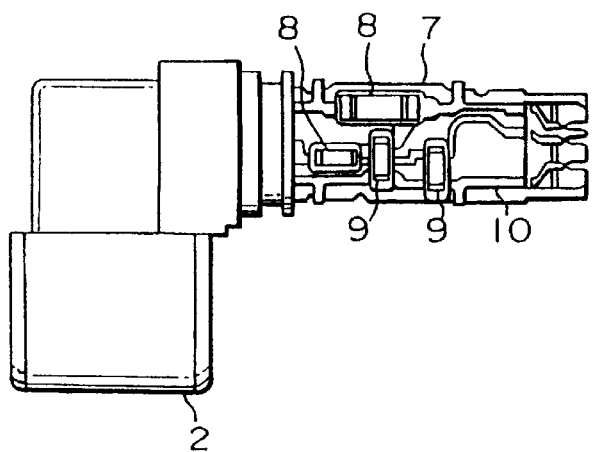
FIG. 28 is a bottom view showing the internal structure of the conventional magnetic field sensing device.

In this magnetic field sensing device, rotation of the gear-like magnetic rotating body 11 shown in FIG. 26 causes concavities 11a and convexities 11b of the magnetic rotating body 11 to alternately approach the magnetic field sensing element, causing a change in the distance between the permanent magnet 5 and the magnetic rotating body 11, thus causing a change in the magnetic field passing through the magnetic field sensing element 19. This change in the magnetic field causes a change in the resistance of the sensing resistors R1, R2, R3, and R4 inside the magnetic field sensing element 19, and as a result, the voltage between connections A and B of the bridge circuit changes.

The change in the voltage between the connections A and B is output via the differential amplification circuit and the comparison circuit (not shown), both in the integrated circuit 23, as a pulse signal from a terminal of the integrated circuit 23 connected with the output side filter circuit 25. This pulse signal is transmitted via the output side filter circuit 25 and the terminal of the connector 2 (see FIG. 2) to the computer unit (not shown), and the computer unit calculates or computes the rotation angle of the magnetic rotating body 11 based on the transmitted signal.

Next, a method of manufacturing the magnetic field sensing device according to the present invention is described.

FIGS. 5 to 10 schematically show a process for manufacturing the magnetic field sensing element of the magnetic field sensing device according to the present invention.

Figure 5:
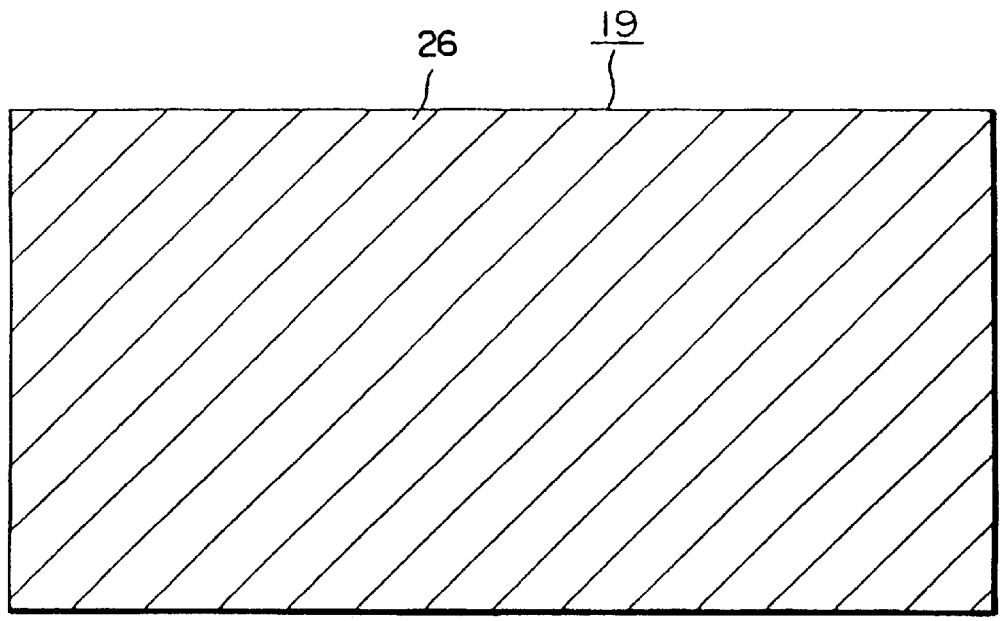
FIG. 5 schematically shows a process of manufacturing the magnetic field sensing element of the magnetic field sensing device according to the present invention.

The magnetic field sensing element 19 shown in FIG. 5 is in a state of being entirely covered with a protective film 26. The integrated circuit 23 formed by patterning an aluminum film has already been formed at the left half of the magnetic field sensing element 19 under the protective film 26. The aluminum film at the left half under the protective film 26 is in the state before the sensing resistors R1, R2, R3, and R4, the power source side resistor R5, and the output side resistor R6 are formed.

It is to be noted that, as described in the above, the aluminum film forming the integrated circuit 23 at the left half is identical to the aluminum film formed at the right half, both of the aluminum films being simultaneously formed in advance by sputtering or the like.

Figure 6:
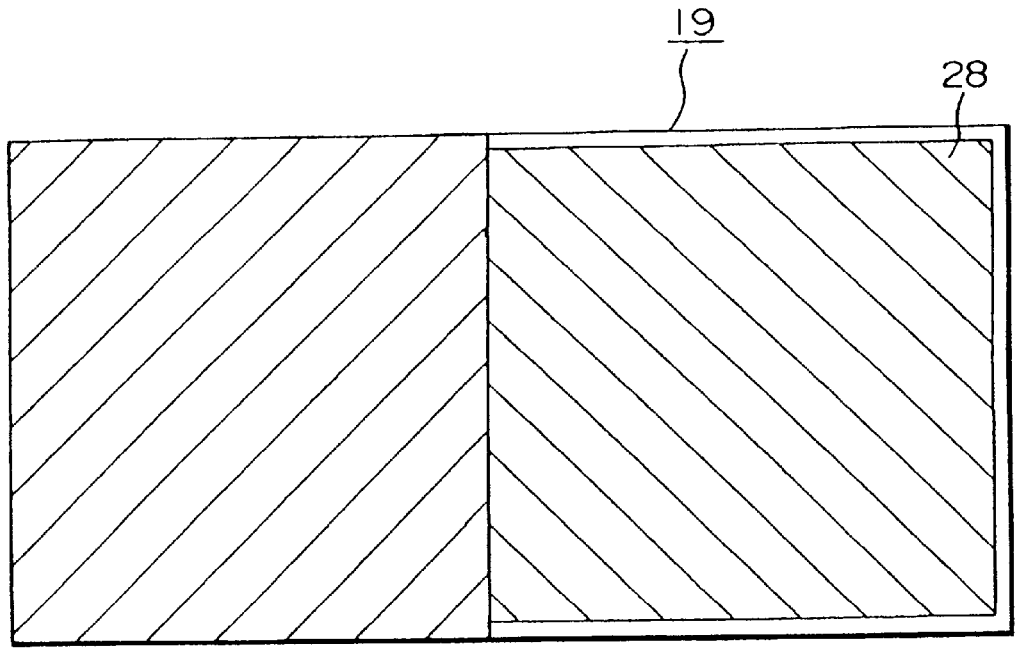
FIG. 6 schematically shows a process of manufacturing the magnetic field sensing element of the magnetic field sensing device according to the present invention.

In the magnetic field sensing element 19 shown in FIG. 5, first, the protective film 26 at the right half thereof is removed by photolithography to expose an aluminum film 28 as a metal film as shown in FIG. 6.

Figure 7:
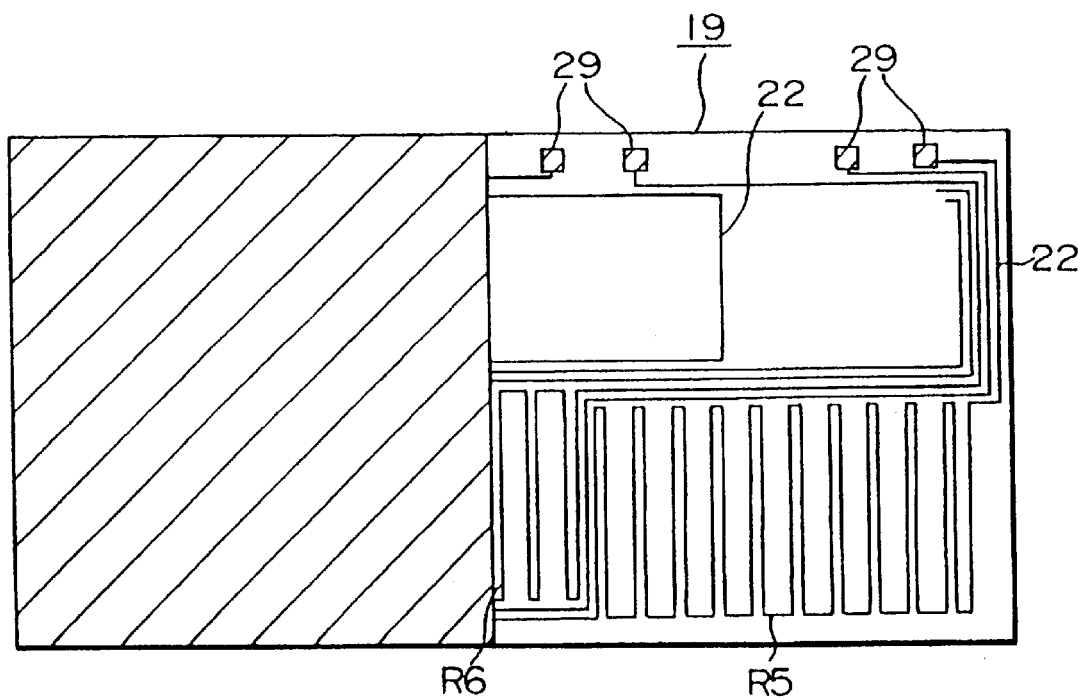
FIG. 7 schematically shows a process of manufacturing the magnetic field sensing element of the magnetic field sensing device according to the present invention.

Next, as shown in FIG. 7, the aluminum film 28 is patterned into a predetermined shape using photolithography. Here, wiring 22 for connecting pads 29 for wire bonding, the power source side resistor R5, the output side resistor R6 and the sensing resistors R1, R2, R3, and R4 with the integrated circuit 23 are formed.

Figure 8:
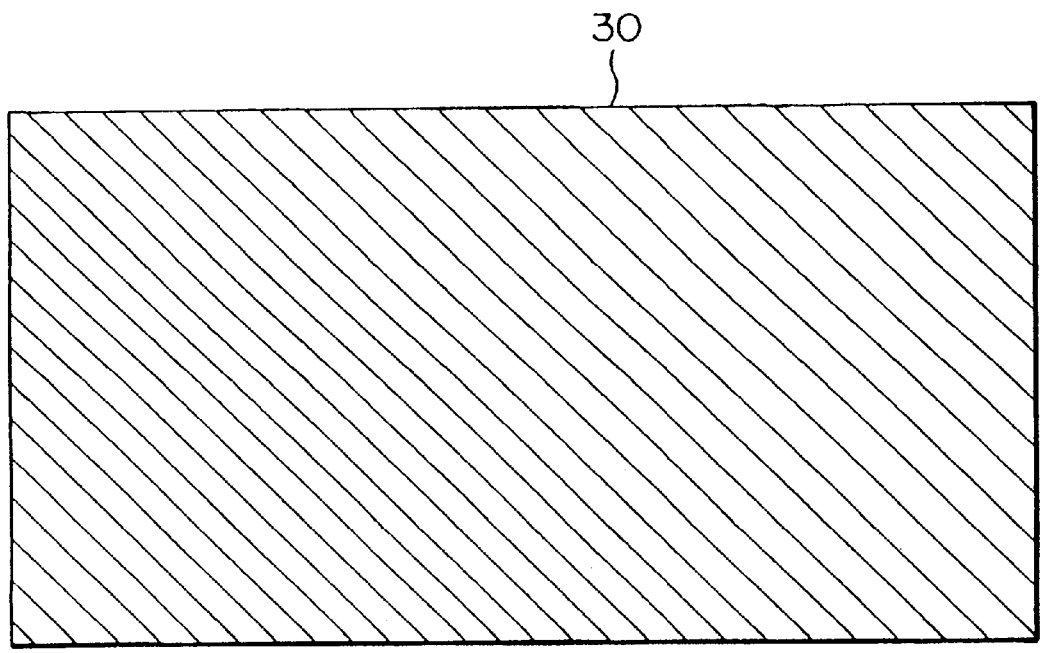
FIG. 8 schematically shows a process of manufacturing the magnetic field sensing element of the magnetic field sensing device according to the present invention.
Figure 9:
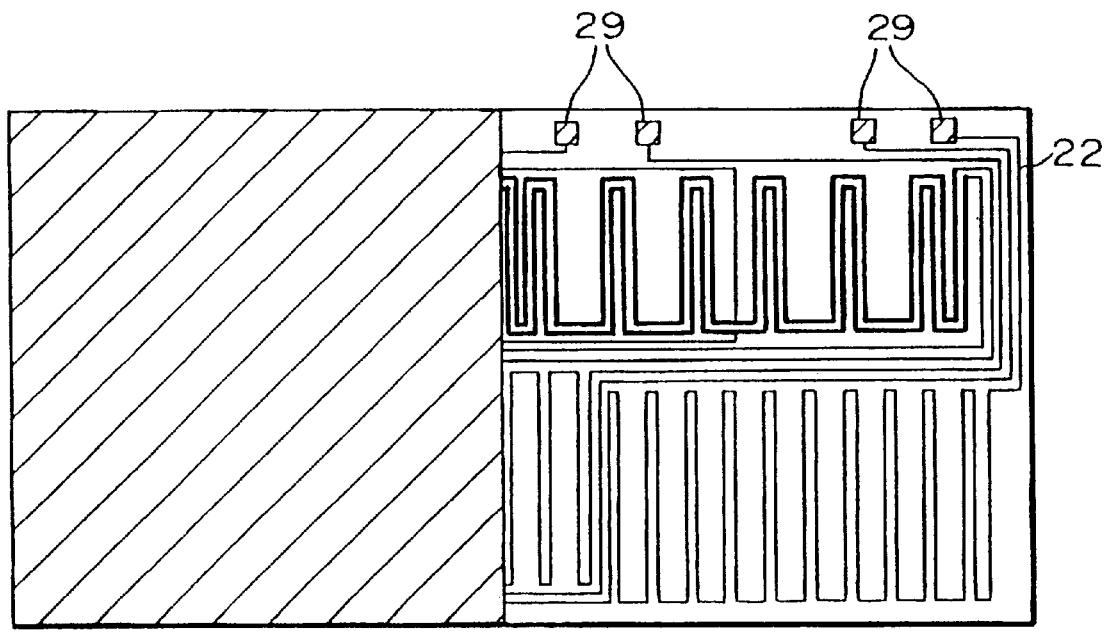
FIG. 9 schematically shows a process of manufacturing the magnetic field sensing element of the magnetic field sensing device according to the present invention.

Then, as shown in FIG. 8, a GMR element film 30 is formed on the entire surface of the magnetic field sensing element 19. Further, as shown in FIG. 9, the GMR element film 30 is patterned using photolithography such that only the portions to be used as the sensing resistors R1, R2, R3, and R4 is left.

Figure 10:
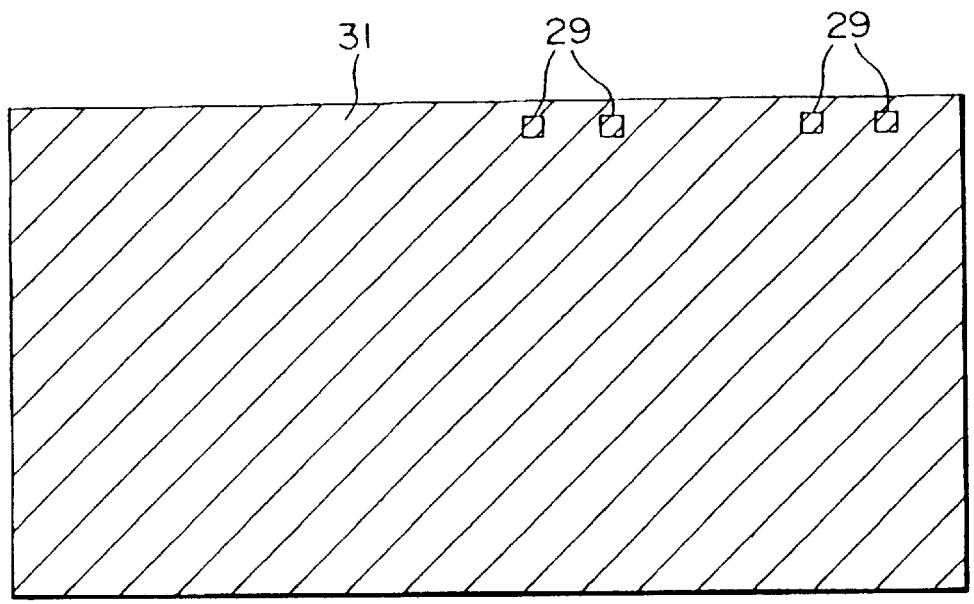
FIG. 10 schematically shows a process of manufacturing the magnetic field sensing element of the magnetic field sensing device according to the present invention.

Lastly, as shown in FIG. 10, a protective film 31 is formed on the entire surface of the magnetic field sensing element 19, and further, the pads 29 for wire bonding are made to open by photolithography.

As described above, according to the magnetic field sensing device of Embodiment 1 of the present invention, since the resistors R5 and R6 for protecting the integrated circuit 23 for processing an output signal of the magnetic field sensing element 19 are formed of the aluminum film 28 as a metal film formed simultaneously with and identical to the aluminum film for forming the integrated circuit 23, the troublesome work of soldering resistors on a substrate in a conventional case can be eliminated, and thus, the productivity can be improved and the manufacturing cost can be lowered.

Further, since the aluminum member to be the input side resistor R5 and the output side resistor R6 is made 10 to 20 $\mu m$ wide and 1 to 2 $\mu m$ thick, electromigration and breaking are not liable to occur and a reliable magnetic field sensing device can be obtained. Further, since the area of the input side resistor R5 and the output side resistor R6 is made small, the magnetic field sensing element can be miniaturized.

Embodiment 2

Figure 11:
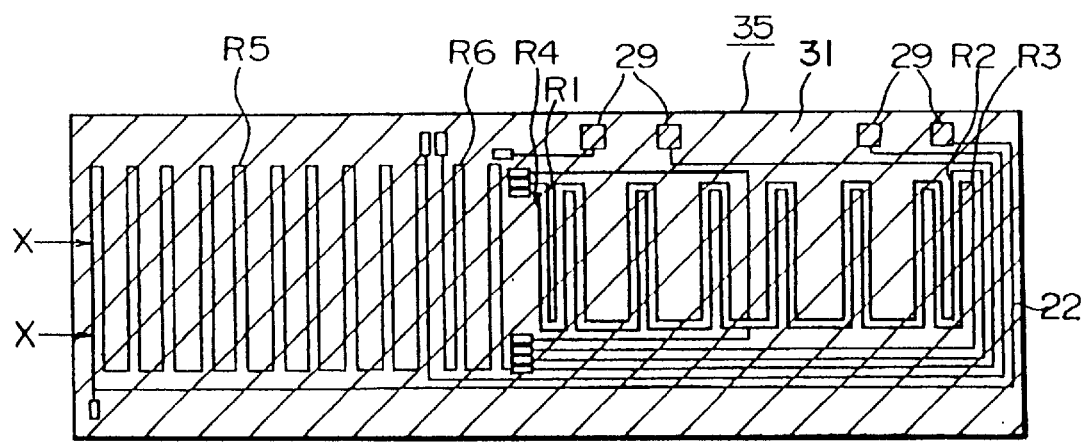
FIG. 11 schematically shows a detector of a magnetic field sensing device according to Embodiment 2 of the present invention.

FIG. 11 schematically shows a sensor of a magnetic field sensing device according to Embodiment 2 of the present invention.

As can be seen in FIG. 11, a magnetic field sensing element 35 is smaller than the magnetic field sensing element according to Embodiment 1 of the present invention.

The magnetic field sensing element 35 shown in FIG. 11 has the power source side resistor R5 and the output side resistor R6 at the left half thereof. As with Embodiment 1, an integrated circuit (not shown) is formed at the left half of the magnetic field sensing element 35. More specifically, the integrated circuit is formed under the power source side resistor R5 and the output side resistor R6 in FIG. 11. It is to be noted that the magnetic field sensing element 35 shown in FIG. 11 is shown in a state before the protective film 31 is formed.

The structure of the magnetic field sensing element of this embodiment is identical to that of the magnetic field sensing element of Embodiment 1 except that the power source side resistor R5 and the output side resistor R6 are formed on the integrated circuit (not shown), and thus, the description thereof is omitted.

Next, a method of manufacturing the magnetic field sensing element 35 of the magnetic field sensing device according to the present invention will be described.

FIGS. 12 to 16 schematically show a process of manufacturing the magnetic field sensing element of the magnetic field sensing device according to Embodiment 2 of the present invention.

Figure 17:
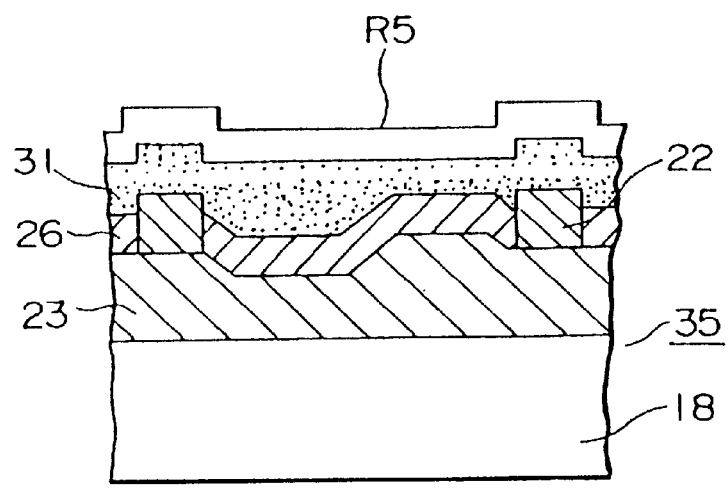
FIG. 17 is a conceptual sectional view of the magnetic field sensing element taken along the line X—X of FIG. 11.

FIG. 17 is a conceptual view of the magnetic field sensing element taken along the line X—X of FIG. 11.

Figure 12:
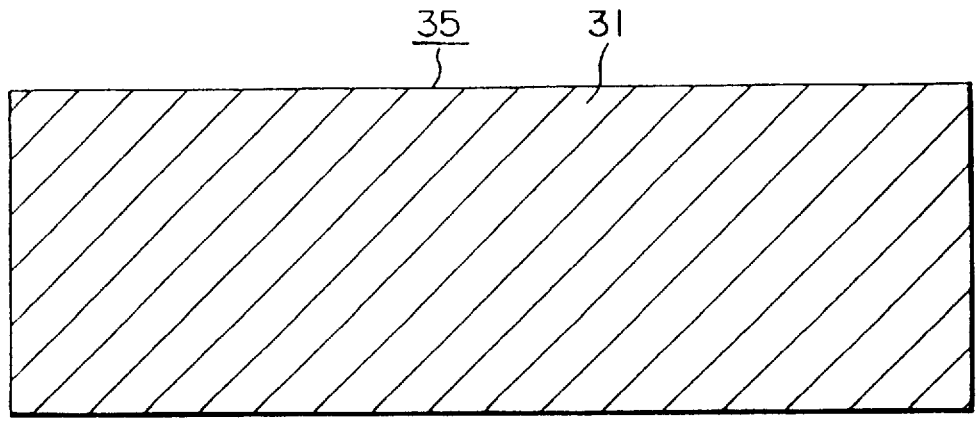
FIG. 12 schematically shows a process of manufacturing a magnetic field sensing element of the magnetic field sensing device according to Embodiment 2 of the present invention.

The magnetic field sensing element 35 shown in FIG. 12 is shown in a state before the sensing resistors R1, R2, R3, and R4, the power source side register R5, and the output side register R6 are formed, and is entirely covered with the protective film 31.

The integrated circuit (not shown) has already been formed at the left half of the magnetic field sensing elements 35 under the protective film 31. The aluminum film at the right half thereof is identical to and formed by a process identical to that of the aluminum film for forming the differential amplification circuit, the comparison circuit and the like (not shown) comprising the integrated circuit.

It is to be noted that, instead of the above-mentioned aluminum film, an underlayer may be formed separately from the protective film 31 at the right half.

Figure 13:
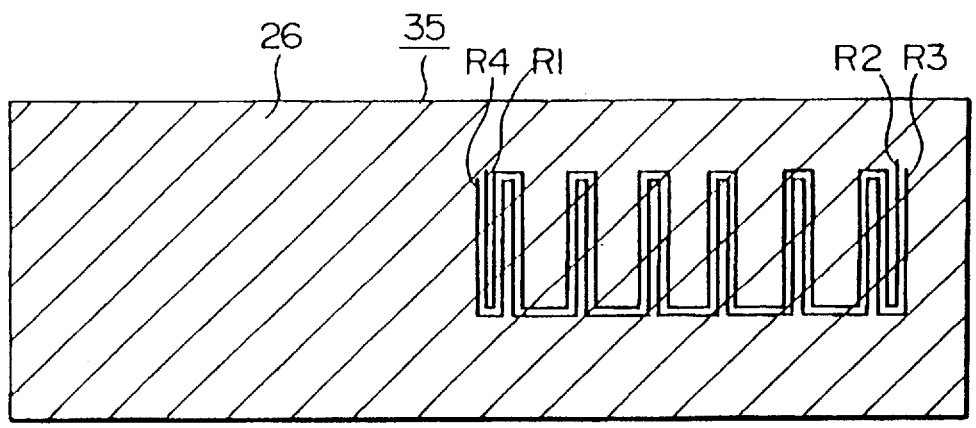
FIG. 13 schematically shows a process of manufacturing the magnetic field sensing element of the magnetic field sensing device according to Embodiment 2 of the present invention.

First, a GMR element film is formed, (this state is not shown) by sputtering or the like, on the entire surface of the magnetic field sensing element 35 in the above state. Next, as shown in FIG. 13, the GMR element film is patterned by photolithography such that only the portions to be used as the sensing resistors R1, R2, R3, and R4 remain.

Figure 14:
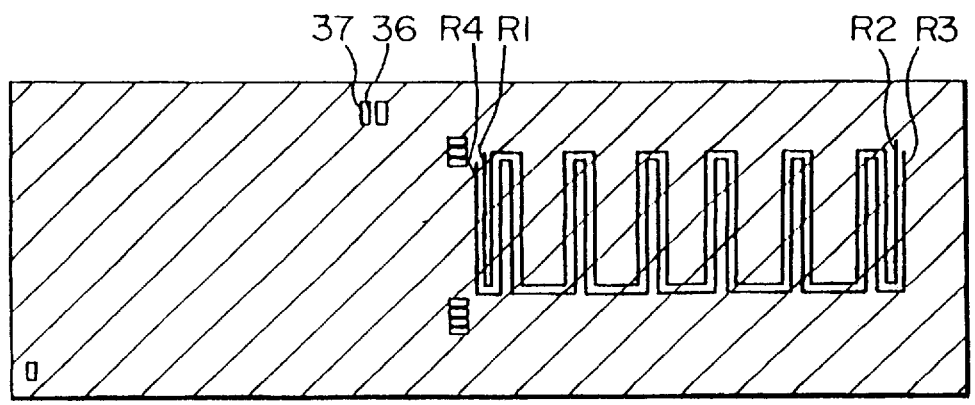
FIG. 14 schematically shows a process of manufacturing the magnetic field sensing element of the magnetic field sensing device according to Embodiment 2 of the present invention.

Then, as shown in FIG. 14, a hole portion 36 for electrically connecting the sensing resistors R1, R2, R3, and R4, the power source side resistor R5, and the output side resistor R6 with the integrated circuit is formed in the protective film 31, and an aluminum pad 37 is exposed in the hole portion 36.

Figure 15:
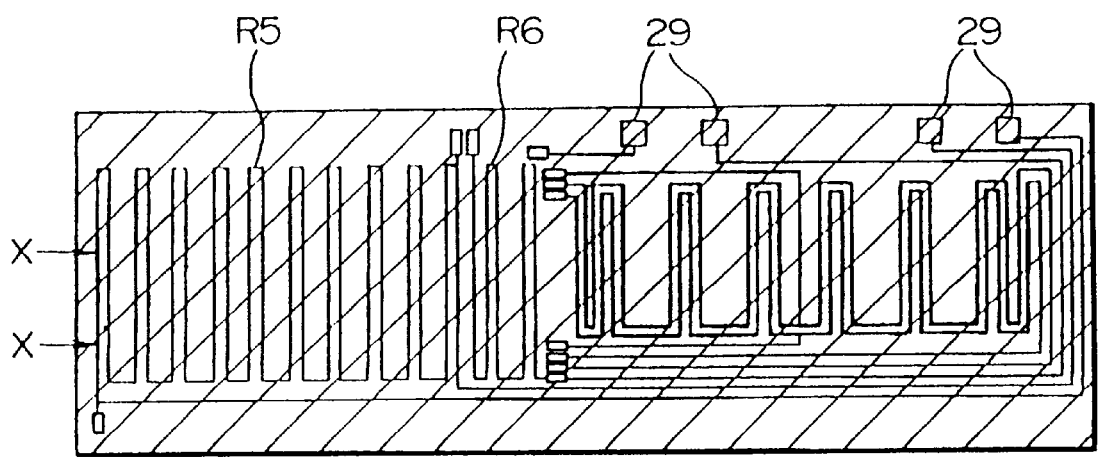
FIG. 15 schematically shows a process of manufacturing the magnetic field sensing element of the magnetic field sensing device according to Embodiment 2 of the present invention.
Figure 16:
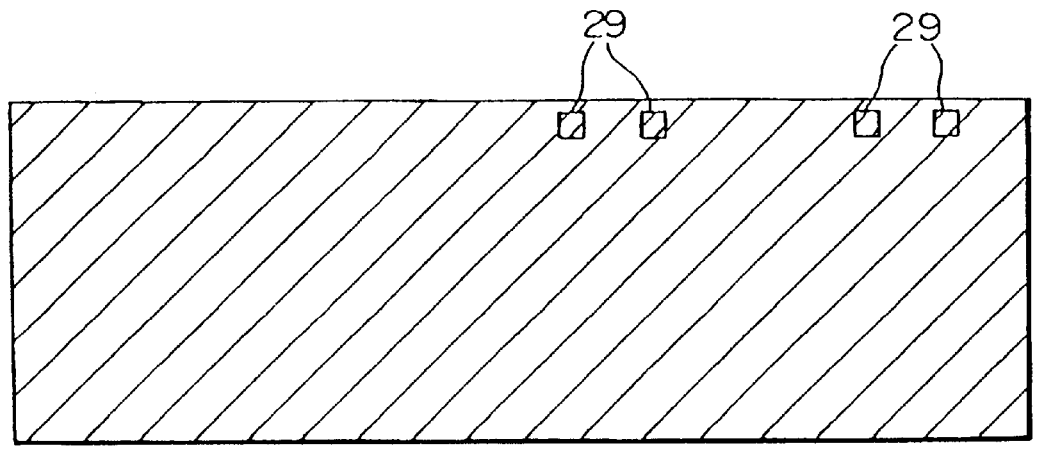
FIG. 16 schematically shows a process of manufacturing the magnetic field sensing element of the magnetic field sensing device according to Embodiment 2 of the present invention.

Then, an aluminum film is formed, by sputtering or the like, on the entire surface of the magnetic field sensing element 35, and the aluminum film is patterned into a predetermined shape using photolithography as shown by thin lines in FIG. 15. Here, the wiring 22 for connecting the pads for wire bonding 29, the power source side resistor R5, the output side resistor R6, and the sensing resistors R1, R2, R3, and R4 with the integrated circuit 23 is formed. In other words, the process of forming the input side resistor R5 and the output side resistor R6 is simultaneous with the process of forming the wiring 22 for connecting the input side resistor R5 and the output side resistor R6 with the integrated circuit 23.

Lastly, the pads 29 for wire bonding are opened by photolithography after a protective film has been formed on the entire surface of the magnetic field sensing element 35.

It is to be noted that a section of the magnetic field sensing element 35 formed in this way taken along the line X—X of FIG. 11 is shown in FIG. 17.

As described above, according to the magnetic field sensing device of Embodiment 2 of the present invention, since the resistors R5 and R6 for protecting the integrated circuit for processing an output signal of the magnetic field sensing element 19 are formed on the integrated circuit, the magnetic field sensing element can be miniaturized and the substrate and the like are made small. Hence, the manufacturing cost of the magnetic field sensing device can be lowered.

Embodiment 3

Figure 18:
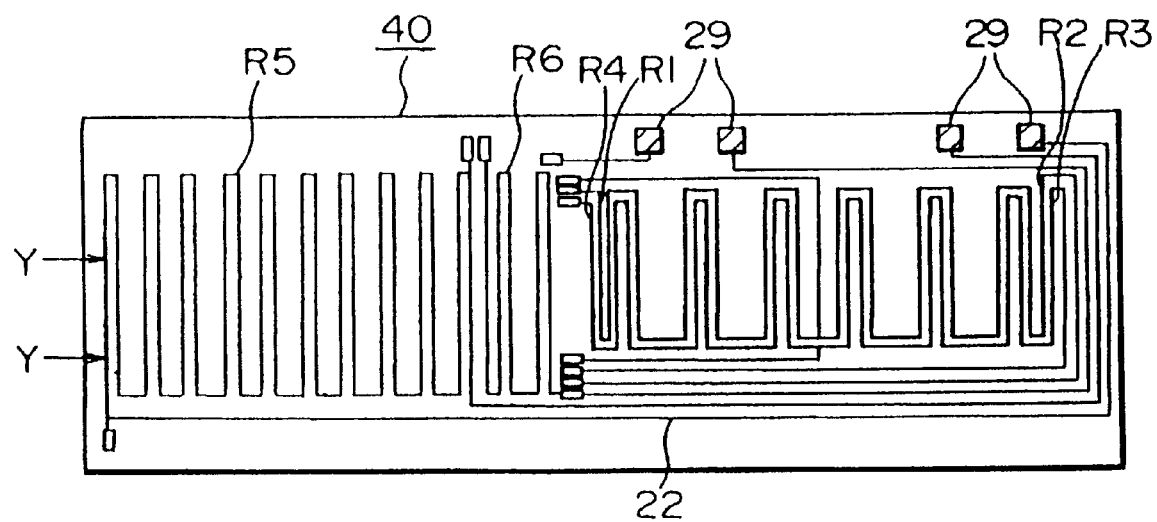
FIG. 18 schematically shows the structure of a magnetic field sensing element according to Embodiment 3 of the present invention.

FIG. 18 schematically shows the structure of a magnetic field sensing element according to Embodiment 3 of the present invention.

Figure 19:
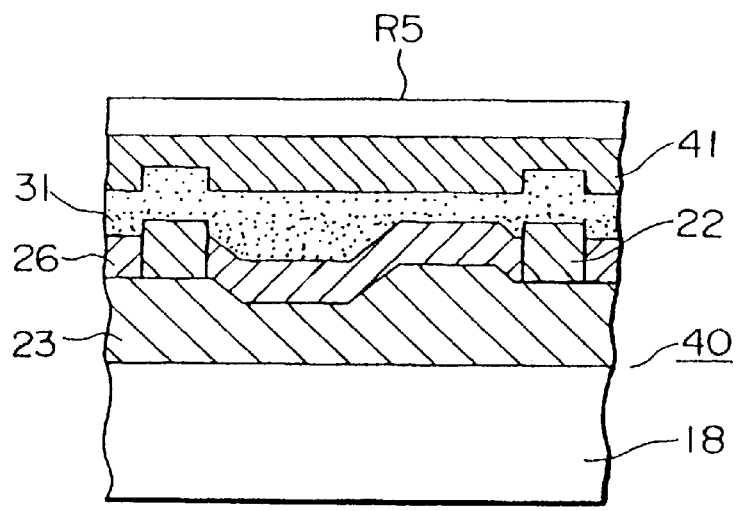
FIG. 19 is a sectional view of the magnetic field sensing element taken along the line Y—Y of FIG. 18.

FIG. 19 is a sectional view of the magnetic field sensing element taken along the line Y—Y of FIG. 18.

In Embodiment 2, the sensing resistors R1, R2, R3, and R4, the power source side resistor R5, and the output side resistor R6 are directly formed on the protective film 31. However, if they are formed via a resist or a resin layer of polyimide, PVSQ, or the like formed on the protective film, the reliability can be further improved.

Since the integrated circuit 23 partly resides under the protective film 31, there is a difference in the level of the surface of the protective film 31 due to the integrated circuit 23. Such a difference in the level of the surface of the protective film 31 is not desirable, because it can cause breakage in the wiring 22, the power source side resistor R5, and the output side resistor R6.

In Embodiment 3, resist 41 as a level difference buffer layer is applied on the protective film 31 by spin coating to make the level difference smaller.

It is to be noted that, instead of the resist, a resin layer of polyimide, PVSQ, or the like may be used to have a similar effect.

Next, a method of manufacturing the magnetic field sensing element 40 of the magnetic field sensing device according to the present invention will be described.

FIGS. 20 to 25 conceptually show the manufacturing process of the magnetic field sensing element according to Embodiment 3 of the present invention.

Figure 20:
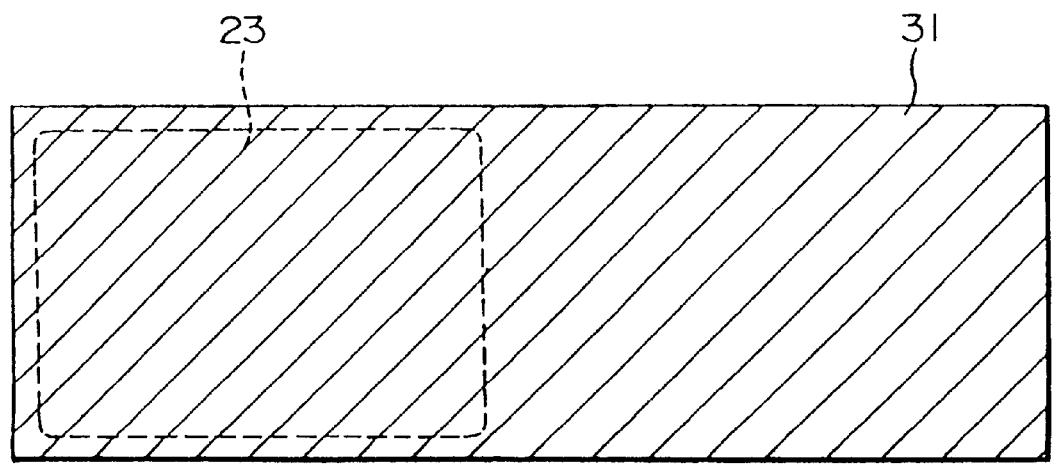
FIG. 20 conceptually shows a process of manufacturing the magnetic field sensing element according to Embodiment 3 of the present invention.

FIG. 20 shows a state where the protective film 31 in FIG. 19 is formed on the entire surface of the substrate. Here, the sensing resistors R1, R2, R3, and R4, the power source side resistor R5, and the output side resistor R6 have not yet been formed.

The integrated circuit 23 is formed under the protective film 31 at the left half of the magnetic field sensing element 40, and at the right half thereof, an aluminum film identical to the aluminum film for forming the integrated circuit 23 is formed by a process identical to that of that aluminum film, or, the protective film 31 shown in FIG. 19 is not removed.

Figure 21:
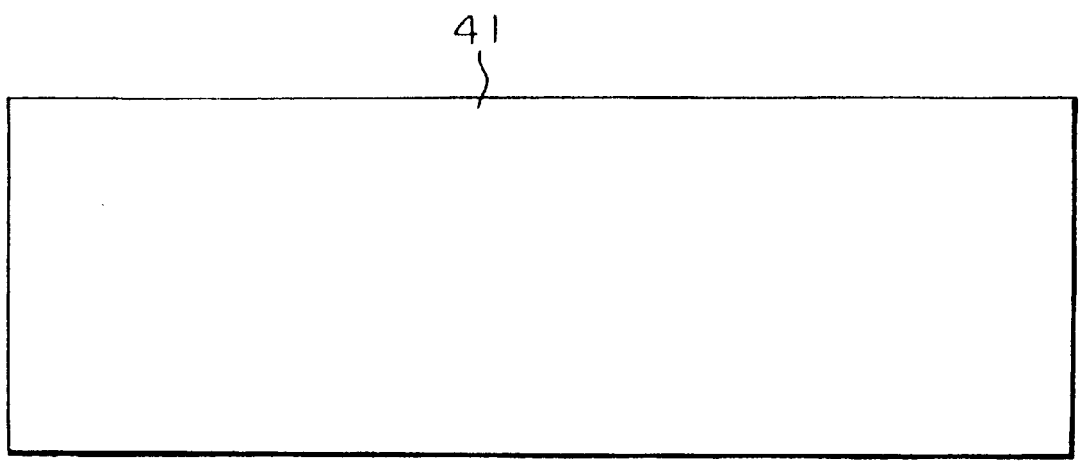
FIG. 21 conceptually shows a process of manufacturing the magnetic field sensing element according to Embodiment 3 of the present invention.

Next, as shown in FIG. 21, the resist 41 is applied to the entire surface of the protective film 31 shown in FIG. 20 by spin coating.

Figure 22:
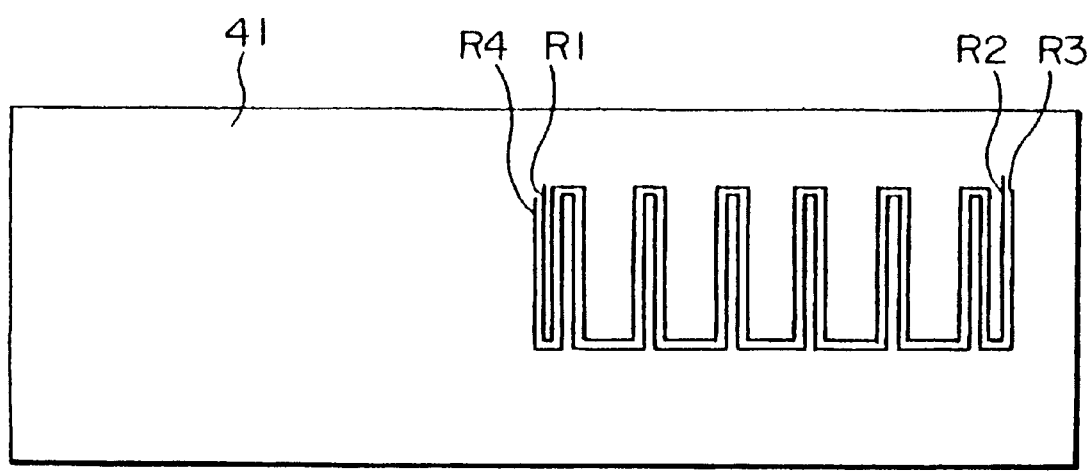
FIG. 22 conceptually shows a process of manufacturing the magnetic field sensing element according to Embodiment 3 of the present invention.

Then, as shown in FIG. 22, a GMR element film is formed (this state is not shown) on the entire surface of the resist 41, and further, the GR element film is patterned by photolithography such that only the portions to be used as the sensing resistors R1, R2, R3, and R4 remain. In this way, the sensing resistors R1 to R4 formed of GMR elements are formed on the resist 41.

Figure 23:
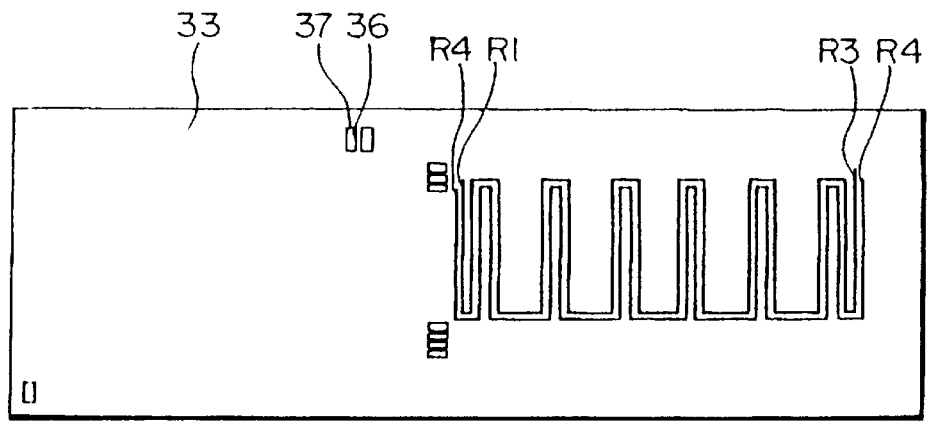
FIG. 23 conceptually shows a process of manufacturing the magnetic field sensing element according to Embodiment 3 of the present invention.

Then, a hole portion 36 for connecting the sensing resistors R1, R2, R3, and R4, the power source side resistor R5, and the output side resistor R6 with the integrated circuit under these resistors is formed by photolithography in the resist 41 and the protective film 31 so as to expose the aluminum pad 37, as shown in FIG. 23.

Figure 24:
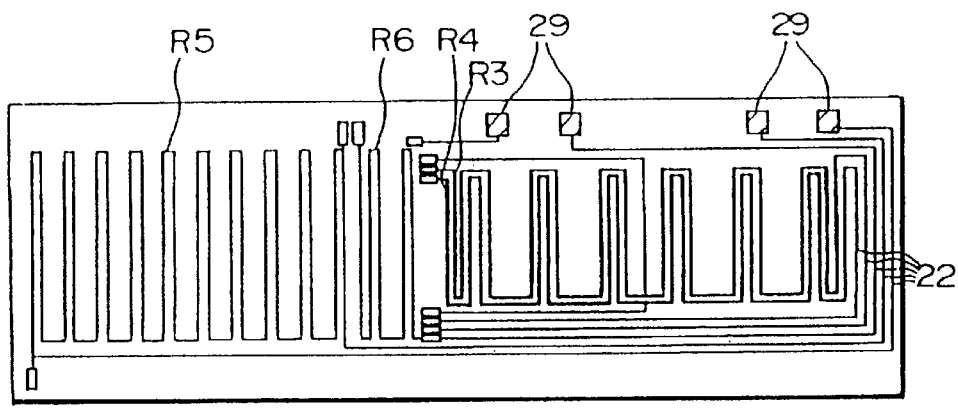
FIG. 24 conceptually shows a process of manufacturing the magnetic field sensing element according to Embodiment 3 of the present invention.

Then, an aluminum film is formed on the resist 41 and the sensing resistors R1 to R5 (this state is not shown), and the aluminum film is patterned into a predetermined shape as shown in FIG. 24 by further use of photolithography. Accordingly, the wiring 22 for connecting the pads for wire bonding 29, the power source side resistor R5, the output side resistor R6, and the sensing resistors R1, R2, R3, and R4 with the integrated circuit 23 is formed.

Figure 25:
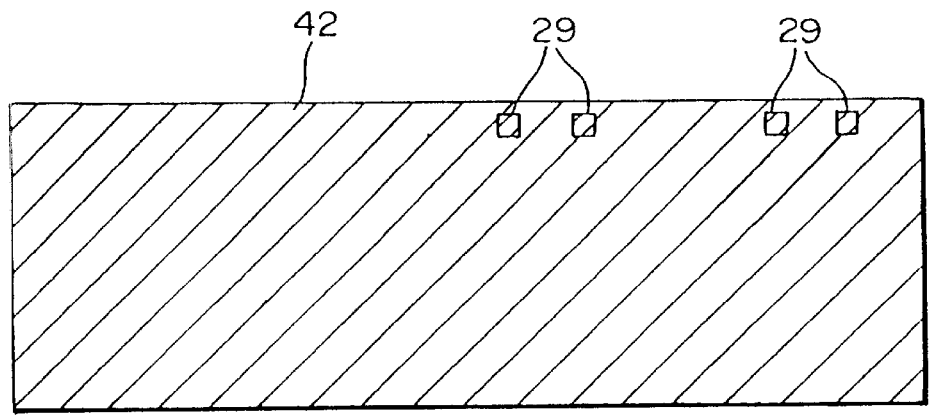
FIG. 25 conceptually shows a process of manufacturing the magnetic field sensing element according to Embodiment 3 of the present invention.

Lastly, as shown in FIG. 25, after a protective film 42 is formed on the entire surface of the element shown in FIG. 24, hole portions are opened by photolithography, and the pads 29 for wire bonding are formed.

As described in the above, according to Embodiment 3 of the present invention, since the power source side resistor R5 and the output side resistor R6 are formed so as to be laminated on the integrated circuit, the magnetic field sensing element can be miniaturized, and the manufacturing cost thereof can be lowered.

Embodiment 4

In Embodiments 1 to 3, magnetic field sensing devices using GMR elements are described as examples, but it goes without saying that the present invention is also applicable to other magnetic field sensing devices using, for example, Hall elements or magnetic resistance elements, and further, to magnetic field sensing devices other than those comprising integrated circuits.

As described in the above, according to Embodiment 4 of the present invention, since the present invention is also applicable to magnetic field sensing devices using Hall elements or magnetic resistance elements and to magnetic field sensing devices without integrated circuits, these devices can also be miniaturized and their manufacturing costs can be lowered.

According to the present invention, the following advantages can be obtained. Since a magnetic field sensing element comprises a giant magnetic resistance element formed on a substrate for detecting a change in a magnetic field, an integrated circuit formed on the substrate for carrying out predetermined arithmetic processing based on a change in the magnetic field detected by the giant magnetic resistance element, and an input side protective resistor and an output side protective resistor provided on the input side and the output side, respectively, of the integrated circuit, the metal film from which the input side resistor and the output side resistor are formed being identical to the metal film from which the integrated circuit is formed, the troublesome work of soldering resistors on a substrate can be eliminated, and thus, the productivity can be improved, the manufacturing cost can be lowered, and the magnetic field sensing device can be miniaturized.

Further, since a magnetic field sensing element in another embodiment of the present invention comprises an integrated circuit formed on a substrate for carrying out predetermined arithmetic processing based on a change in a magnetic field detected by a giant magnetic resistance element, a level difference buffer layer formed on the integrated circuit and having a smooth surface, an input side protective resistor and an output side protective resistor provided together with the giant magnetic resistance element on the level difference buffer layer and connected to the input side and the output side, respectively, of the integrated circuit, and wiring for connecting the input side protective resistor with the integrated circuit and for connecting the output side protective resistor with the integrated circuit, the metal film from which the input side resistor and the output side resistor are formed being identical to the metal film from which the wiring is formed, the troublesome work of soldering resistors on a substrate can be eliminated, and thus, the productivity can be improved, the manufacturing cost can be lowered, and the magnetic field sensing device can be miniaturized.

Still further, since the metal film has a specific resistance of $2\times10^{-6}$ $\Omega\cdot$cm or more, the input side resistor and the output side resistor can be formed with a small area and the substrate can be made smaller, and thus, the magnetic field sensing element can be provided at a low cost.

Still further, since the metal film is mainly formed of aluminum, the input side resistor and the output side resistor can be formed with a small area, and the manufacturing cost can be lowered.

Still further, since the input side resistor and the output side resistor formed of the metal film are made with a 10 to 20 $\mu$m width, they can be formed with a small area, and a reliable magnetic field sensing device which is resistant to electromigration and is not liable to break can thus be obtained.

Still further, since the input side resistor and the output side resistor formed of the metal film are made with a 1 to 2 $\mu$m thickness, they can be formed with a small area, and a reliable magnetic field sensing device which is resistant to electromigration and is not liable to break can thus be obtained.

Still further, since the input side resistor and the output side resistor are formed on the substrate and the input side resistor, the output side register, and the wiring around them are not liable to break, a reliable magnetic field sensing device can be obtained.

Since a magnetic field sensing device according to the present invention comprises a magnetic rotating body having convexities and concavities along its outer periphery for rotating about an axis of rotation, a magnet arranged so as to face the outer periphery of the magnetic rotating body, and the above-mentioned magnetic field sensing element attached to a surface of the magnet facing the outer periphery of the magnetic rotating body, and the magnetic element detects a change in a magnetic field between the magnetic rotating body and the magnet upon rotation of the magnetic rotating body and, based on the result of the detection, calculates the amount of rotation of the magnetic rotating body, a magnetic field sensing device with a high detection accuracy can be provided at a low cost.

What is claimed is:

1. A magnetic field sensing element comprising:
    a giant magnetic resistance element formed on a substrate for detecting a change in a magnetic field;
    an integrated processing circuit formed on said substrate for performing predetermined arithmetic processing based on a change in said magnetic field detected by said giant magnetic resistance element; and
    an input side protective resistor and an output side protective resistor provided on the input side and the output side, respectively, of said integrated circuit,
    wherein said input side resistor, said output side resistor and said integrated circuit are formed from a same metal film.

2. A magnetic field sensing element comprising:

an integrated processing circuit formed on a substrate for performing predetermined arithmetic processing based on a change in a magnetic field detected by a giant magnetic resistance element;

a protective layer formed on said integrated circuit and having a smooth surface;

an input side protective resistor and an output side protective resistor provided on said protective layer together with said giant magnetic resistance element and connected to the input side and the output side, respectively, of said integrated circuit; and wiring for connecting said input side protective resistor with said integrated circuit and for connecting said output side protective resistor with said integrated circuit, wherein said input side resistor, said output side resistor and said wiring are formed from a same metal film.

3. A magnetic field sensing element as claimed in claim 1, wherein said metal film has a specific resistance of $2 \times 10^{-6}$ Ω·cm or more.

4. A magnetic field sensing element as claimed in claim 3, wherein said metal film comprises aluminum.

5. A magnetic field sensing element as claimed in claim 4, wherein said input side resistor and said output side resistor formed of said metal film are 10 to 20 $\mu$m in width.

6. A magnetic field sensing element as claimed in claim 4, wherein said input side resistor and said output side resistor formed of said metal film are 1 to 2 $\mu$m in thickness.

7. A magnetic field sensing element as claimed in claim 1, wherein said input side resistor and said output side resistor are formed on said substrate.

* * * * *